(12) United States Patent  
Goerlach et al.

(10) Patent No.: US 8,427,801 B2  
(45) Date of Patent: Apr. 23, 2013

(54) RECTIFIER CIRCUIT

(75) Inventors: Alfred Goerlach, Kusterdingen (DE); Markus Baur, Rottenburg (DE)

(73) Assignee: Robert Bosch GmbH, Stuttgart (DE)

( * ) Notice: Subject to any disclaimer, the term of this patent is extended or adjusted under 35 U.S.C. 154(b) by 168 days.

(21) Appl. No.: 12/745,751

(22) PCT Filed: Oct. 31, 2008

(86) PCT No.: PCT/EP2008/064824  
§ 371 (c)(1), (2), (4) Date: Jun. 2, 2010

(87) PCT Pub. No.: WO2009/077257  
PCT Pub. Date: Jun. 25, 2009

(65) Prior Publication Data  
US 2010/0244559 A1 Sep. 30, 2010

(30) Foreign Application Priority Data  
Dec. 14, 2007 (DE) .......................... 10 2007 060 219

(51) Int. Cl.
| | |
|---|---|
| H02H 3/20 | (2006.01) |
| H02H 9/04 | (2006.01) |
| B60L 3/00 | (2006.01) |
| H02M 7/217 | (2006.01) |
| H02M 7/00 | (2006.01) |

(52) U.S. Cl.  
USPC ........... 361/91.1; 307/9.1; 363/127; 363/125; 363/84; 363/89

(58) Field of Classification Search ................. 361/91.1, 361/20, 21, 56; 307/9.1; 363/127, 84, 89, 363/125, 44, 48, 52, 53, 61, 70  
See application file for complete search history.

(56) References Cited

U.S. PATENT DOCUMENTS

| | | | | |
|---|---|---|---|---|
| 3,866,063 | A * | 2/1975 | Long | 327/576 |
| 4,890,185 | A | 12/1989 | Karl et al. | |
| 5,510,972 | A * | 4/1996 | Wong | 363/127 |
| 5,602,508 | A | 2/1997 | Endou et al. | |
| 6,212,084 | B1 | 4/2001 | Turner | |
| 6,324,084 | B1 * | 11/2001 | Fujisawa | 363/127 |
| 6,421,261 | B1 * | 7/2002 | Fujisawa et al. | 363/127 |
| 6,563,725 | B2 * | 5/2003 | Carsten | 363/127 |

(Continued)

FOREIGN PATENT DOCUMENTS

| | | |
|---|---|---|
| EP | 0 321 663 | 6/1989 |
| EP | 0 777 309 | 6/1997 |

(Continued)

OTHER PUBLICATIONS

International Search Report in International Application No. PCT/EP2008/064824 dated Feb. 3, 2009.

(Continued)

*Primary Examiner* — Rexford Barnie  
*Assistant Examiner* — Dru Parries  
(74) *Attorney, Agent, or Firm* — Kenyon & Kenyon LLP

(57) ABSTRACT

Rectifier circuits which are usable, instead of diodes, for rectifying alternating voltages, and which, like diodes, form two-terminal networks having a cathode terminal and an anode terminal. The power loss of these rectifier circuits is clearly less that the power loss of silicon p-n diodes. These rectifier circuits also include voltage clamping functions.

15 Claims, 4 Drawing Sheets

U.S. PATENT DOCUMENTS

| | | | | |
|---|---|---|---|---|
| 7,170,768 | B2 * | 1/2007 | Heurtier et al. | 363/127 |
| 7,199,636 | B2 * | 4/2007 | Oswald et al. | 327/325 |
| 7,242,597 | B2 * | 7/2007 | Shodo | 363/127 |
| 7,245,514 | B2 * | 7/2007 | Shao et al. | 363/127 |
| 7,408,796 | B2 * | 8/2008 | Soldano | 363/127 |
| 7,440,299 | B2 * | 10/2008 | Rivet | 363/89 |
| 7,791,914 | B1 * | 9/2010 | Thakur et al. | 363/127 |
| 8,031,498 | B2 * | 10/2011 | Deboy et al. | 363/127 |

FOREIGN PATENT DOCUMENTS

| | | |
|---|---|---|
| EP | 1 521 354 | 4/2005 |
| JP | 2-4009 | 1/1990 |
| JP | 2000-175455 | 6/2000 |
| JP | 2003-533118 | 11/2003 |
| JP | 2004-519991 | 7/2004 |

OTHER PUBLICATIONS

Rees S et al : "A smart synchronous rectifier for 12 V automobile alternators" PESC '03. 2003 IEEE 34th. Annual Power Electronics Specialists Conference. Conference Proceedings. Acapulco, Mexico, Jun. 15-19, 2003 ; [Annual Power Electronics Specialists Conference] , New York, NY ; IEEE, US, vol. 4, Jun. 15, 2003, pp. 1516-1521, XP010648456, ISBN: 978-0-7803-7754-7.

Tietze U. et al : "Halbleiter-Schaltungstechnik, Fuenfte Auflage" Halbleiter-Schaltungstechnik, Berlin, Springer-Verlag, DE, Jan. 1, 1980, pp. 111-113, XP002205656, p. 112; figure 7.4.

Ian Robertson Sinclair : "Practical Electronics Handbook" Feb. 11, 2000, Newnes, Elsevier Ltd., Oxford, XP002510291, pp. 56-57; figure 2.4.

* cited by examiner

RECTIFIER CIRCUIT

FIELD OF THE INVENTION

The present invention relates to a rectifier circuit.

BACKGROUND INFORMATION

For the generation of direct voltages from AC voltages, at the present time mostly rectifier bridges are used which are made up of an interconnection of diodes.

The conversion of an AC voltage to a DC voltage takes place in a motor vehicle, for instance, in which an AC voltage is generated by a generator which is converted by a post-connected rectifier bridge to a DC voltage.

An example for such a voltage supply of a motor vehicle is shown in FIG. 1. This includes a generator device GEN which has an excitation winding G and radially connected phase windings U, V and W. The phase voltages provided at phase windings U, V and W are supplied to a rectifier bridge RF, which provides the desired DC voltage at its output. Rectifier bridge RF includes three bridge branches. In each of these bridge branches two silicon p-n diodes D are provided.

Conditioned physically, during a forward operation of a silicon p-n diode in rectifier applications, diode forward voltages of ca. 800 mV to ca. 2 V come about. These diode forward voltages, at meaningful dimensioning, are usually not able to be lowered below ca. 1 V. Therefore, especially in the case of the rectification of lower alternating voltages, power losses are created at the rectifier diodes. In generators used for the voltage supply of passenger vehicles, the alternating voltages that are to be rectified usually amount to about 17 V peak-to-peak between the terminals of two phase windings. Since the current flows via two rectifier diodes, because of the rectification, a voltage reduction is created averaging about 2 V. In this example, the power loss in the rectifier at corresponding load amounts to about 20% of the power output. The power loss converted in the rectifier has to be eliminated in the form of heat by costly cooling elements. In addition, the power losses directly affect the fuel consumption of the respective vehicle.

SUMMARY OF THE INVENTION

By contrast, a rectifier circuit having the features described herein has the advantage that the power loss is reduced, and for this reason, the expenditure for cooling may also be reduced.

This is achieved essentially in that, in a rectifier bridge, instead of silicon p-n diodes, rectifier circuits according to the exemplary embodiments and/or exemplary methods of the present invention are used, each silicon p-n diode of the rectifier bridge being able to be replaced by such a rectifier circuit. Circuit engineering changes of the overall system are not necessary. The rectifier circuits according to the exemplary embodiments and/or exemplary methods of the present invention require no separate power supply and also no separate signal inputs.

The forward voltages of silicon p-n diodes in rectifier operation can usually not be lowered below ca. 1.1 V. By using rectifier circuits according to the present invention, instead of silicon p-n diodes, the forward voltages are able to be lowered to ca. 25 mV. This makes it possible clearly to reduce the power losses of rectifiers and the expenditure for their cooling.

Further advantageous characteristics of the exemplary embodiments and/or exemplary methods of the present invention are yielded by the following explanation of exemplary embodiments with reference to FIGS. 2-7.

DETAILED DESCRIPTION

Figure 1:
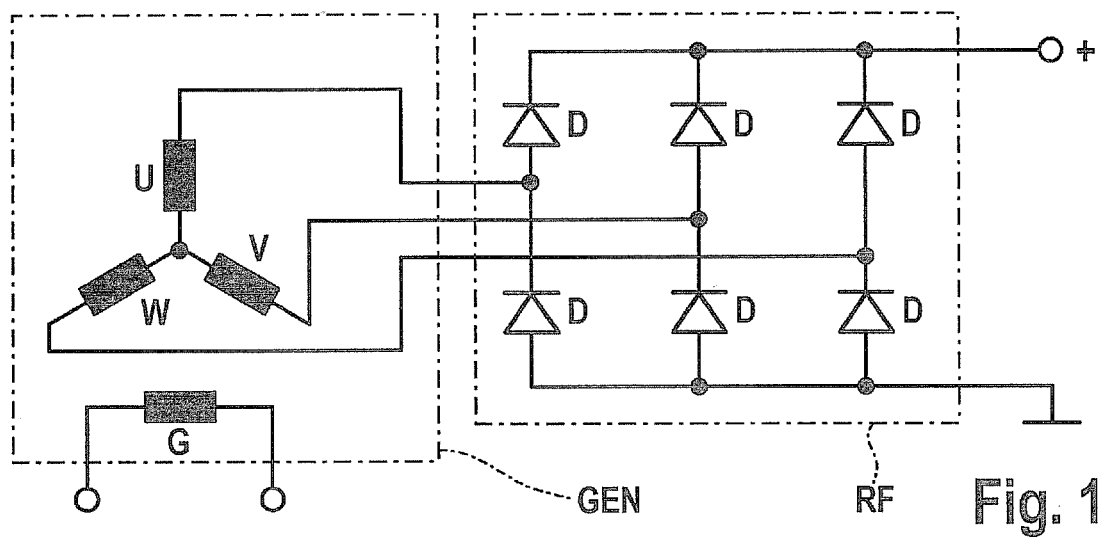
FIG. 1 shows an example for a voltage supply of a motor vehicle.
Figure 2:
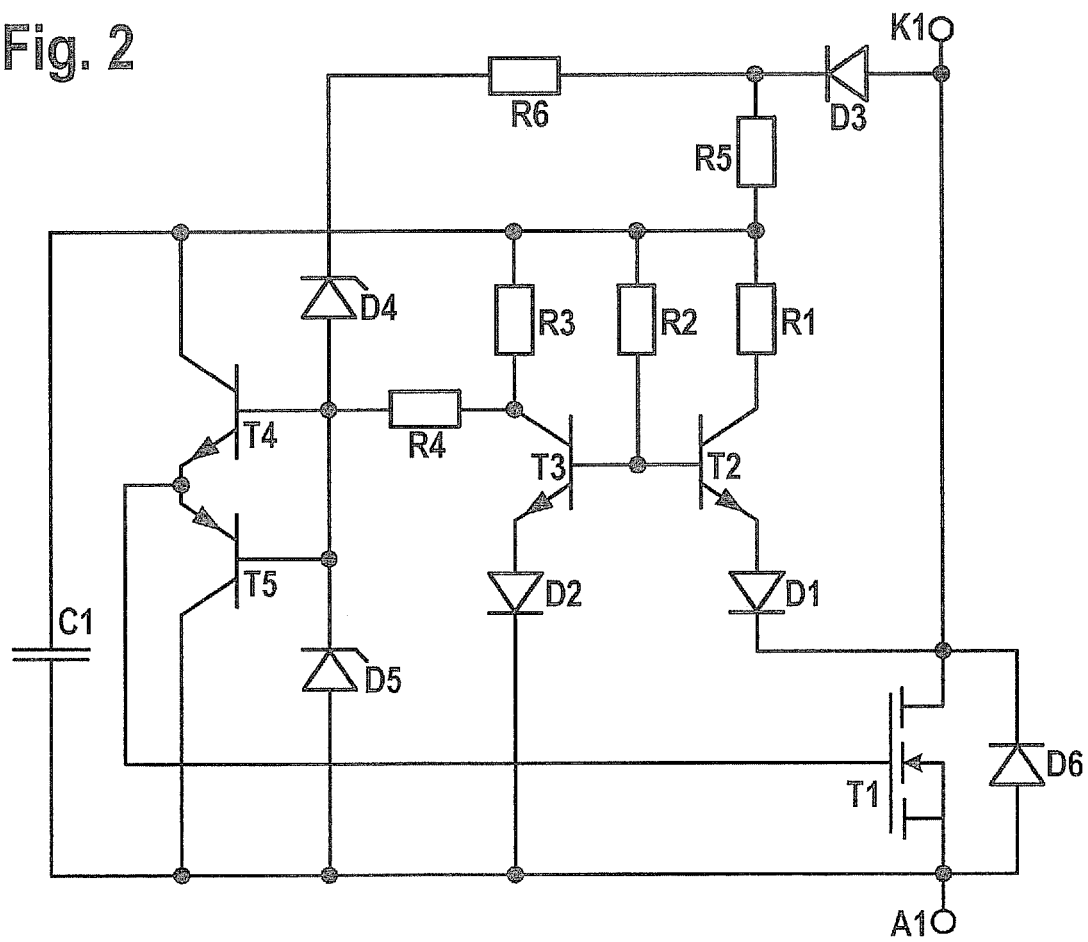
FIG. 2 shows a rectifier circuit according to a first exemplary embodiment of the present invention.

FIG. 2 shows a rectifier circuit according to a first exemplary embodiment of the present invention.

The rectifier circuit shown in FIG. 2 may be used, for example, in a rectifier bridge instead of a silicon p-n diode. It has a cathode terminal K1 and an anode terminal A1, the same as a silicon p-n diode. MOS transistor T1 and inverse diode D6 are connected in parallel, and from a technological point of view, in this circuit, together they form a microelectronic component.

The rectifier circuit shown in FIG. 2 has a symmetrically designed differential amplifier, which is formed by transistors T2 and T3 and resistors R1, R2 and R3. A first input of this differential amplifier is connected via a diode D1 to cathode terminal K1 and the drain terminal of MOS transistor T1. A second input of this differential amplifier is connected via a diode D2 to anode terminal A1. This differential amplifier amplifies the potential difference present between cathode terminal K1 and anode terminal A1 of the rectifier circuit. Because of the symmetrical construction of the differential amplifier, temperature differences and ageing effects act only slightly on the properties of the differential amplifier.

The output signal of the differential amplifier is available at the collector of transistor T3, and is passed on via a resistor R4 to the input of a power amplifying stage. This power amplifying stage is made up of transistors T4 and T5, whose bases are connected together. Zener diode 5 acts as a protective element for transistor T1 and protects its gate from overvoltages.

In the case of the rectification of an alternating voltage, an alternating voltage of frequency f is present between cathode terminal K1 and anode terminal A1. At a positive potential at cathode terminal K1, MOS transistor T1 with its integrated inverse diode D6 is in blocking operation and capacitor C1 is able to charge via diode D3 and resistor R5. The voltage present at capacitor C1 is used for supplying the additional components of the rectifier circuit.

If, on the other hand, the electrical potential at cathode terminal K1 is more negative than the electrical potential at anode terminal A1 of the rectifier circuit, then the gate-to-source voltage of MOS transistor T1 is positive and greater than its threshold voltage. At these conditions, MOS transistor T1 is conductive, a current flow having this current direction causing only a slight voltage drop.

If the electrical potential at cathode terminal K1 of the rectifier circuit is again more positive than the electrical potential at anode terminal A1 of the rectifier circuit, then the gate-to-source voltage of MOS transistor T1 is less than its threshold voltage. Under these conditions MOS transistor T1 blocks. For this reason, the current flow through MOS transistor T1 is only very small.

If the electrical potential at cathode terminal K1 of the rectifier circuit is more positive than the electrical potential at anode terminal A1 of the rectifier circuit and if this potential difference exceeds a value set by Zener diode D4, the input potential of the power amplifying stage consisting of transistors T4 and T5 is raised. This also increases the gate-to-source voltage of MOS transistor T1 and a current flow comes about between the drain and the source of MOS transistor T1. At the conditions given, this current flow limits the electrical potential difference between cathode terminal K1 and anode terminal A1 of the rectifier circuit to a predetermined value. This feature of the limiting of the potential difference represents voltage clamping and constitutes a load dump protection in special cases.

Figure 3:
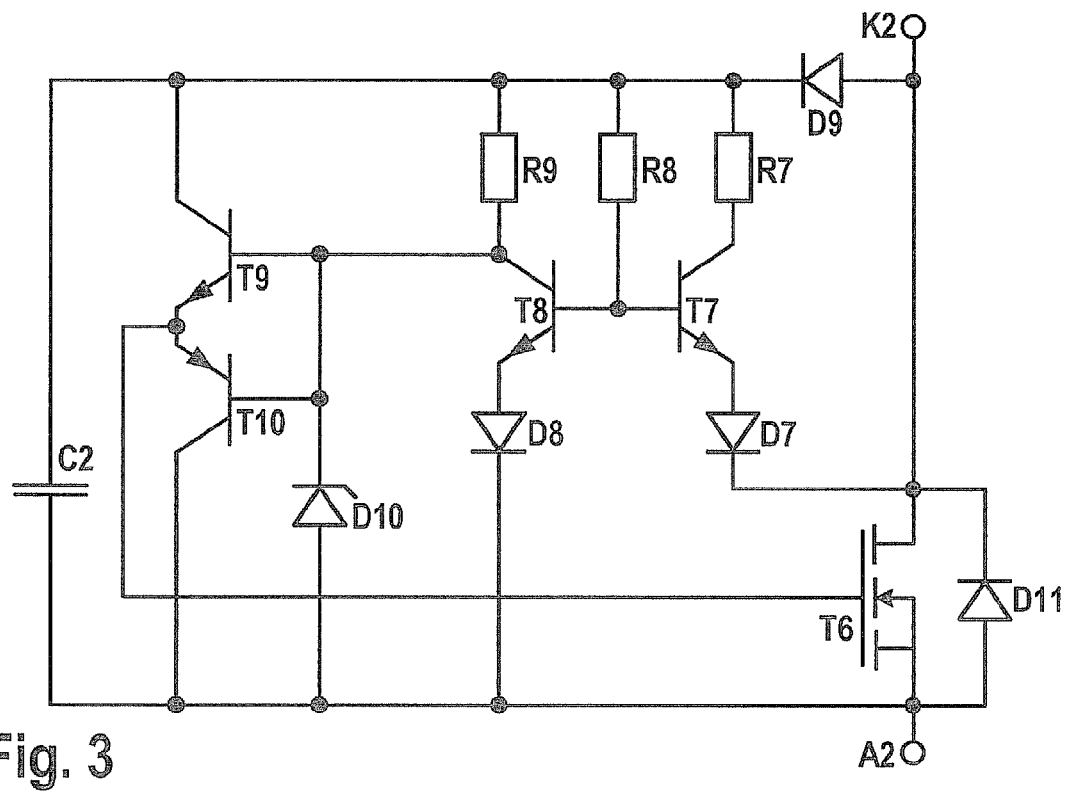
FIG. 3 shows a rectifier circuit according to a second exemplary embodiment of the present invention.

FIG. 3 shows a rectifier circuit according to a second exemplary embodiment of the present invention. The design and the functionality of the rectifier circuit shown in FIG. 3 agree to a great extent with the design and functionality of the rectifier circuit shown in FIG. 2. The rectifier circuit shown in FIG. 3 differs from the rectifier circuit shown in FIG. 2 only in that the bases of the two transistors T9 and T10, which form the power amplifying stage, are not connected to the cathode of diode D9 via a Zener diode and a resistor. Accordingly, the exemplary embodiment shown in FIG. 3 does not have the feature of limiting the potential difference between cathode terminal K2 and anode terminal A2 of the rectifier circuit, that is, the feature of voltage clamping.

Figure 4:
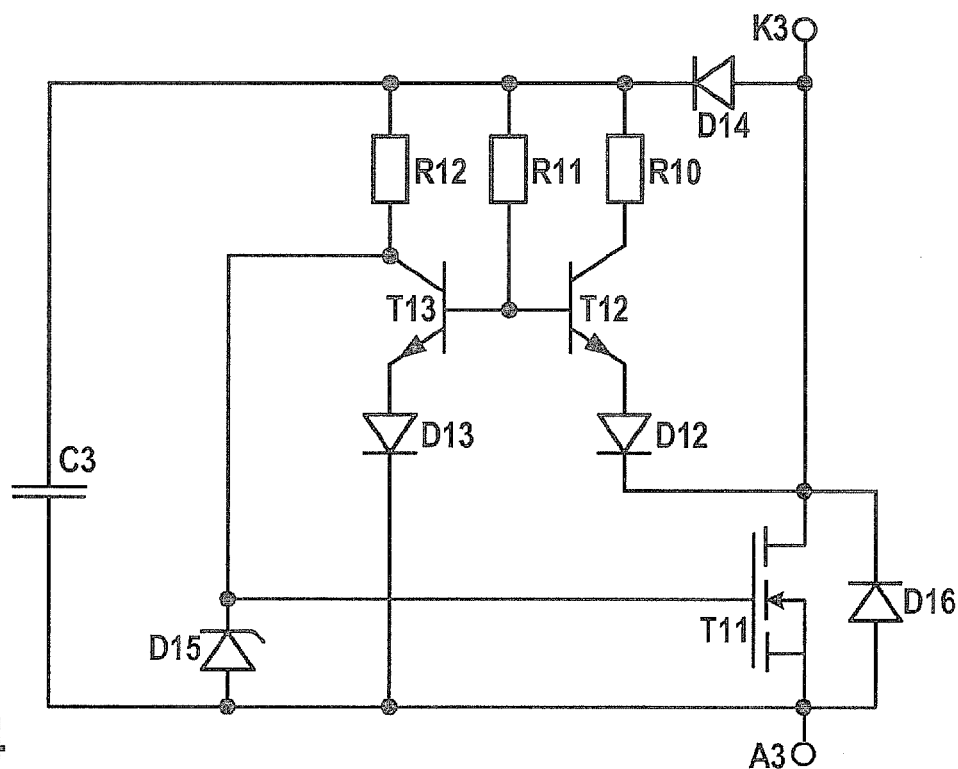
FIG. 4 shows a rectifier circuit according to a third exemplary embodiment of the present invention.

FIG. 4 shows a rectifier circuit according to a third exemplary embodiment of the present invention. The design and the functionality of the rectifier circuit shown in FIG. 4 agree to a great extent with the design and functionality of the rectifier circuit shown in FIG. 2. The rectifier circuit shown in FIG. 4 differs from the rectifier circuit shown in FIG. 2 in that the functional features of voltage clamping and power amplification are not provided. The control of the control input and of the gate terminal of MOS transistor T11 takes place directly from the output of the differential amplifier, which in the exemplary embodiment shown in FIG. 4 is formed by transistors T12 and T13 and resistors R10, R11 and R12.

In this exemplary embodiment, by omitting the power amplifying stage, conditioned upon the dimensioning of the additional components of the rectifier circuit, the power consumption of the circuit is able to increase. Furthermore, the maximum frequency f of the voltage that is to be rectified is also able to be reduced, since the charging and discharging of the gate of MOS transistor T11 takes place more slowly at these conditions.

Figure 5:
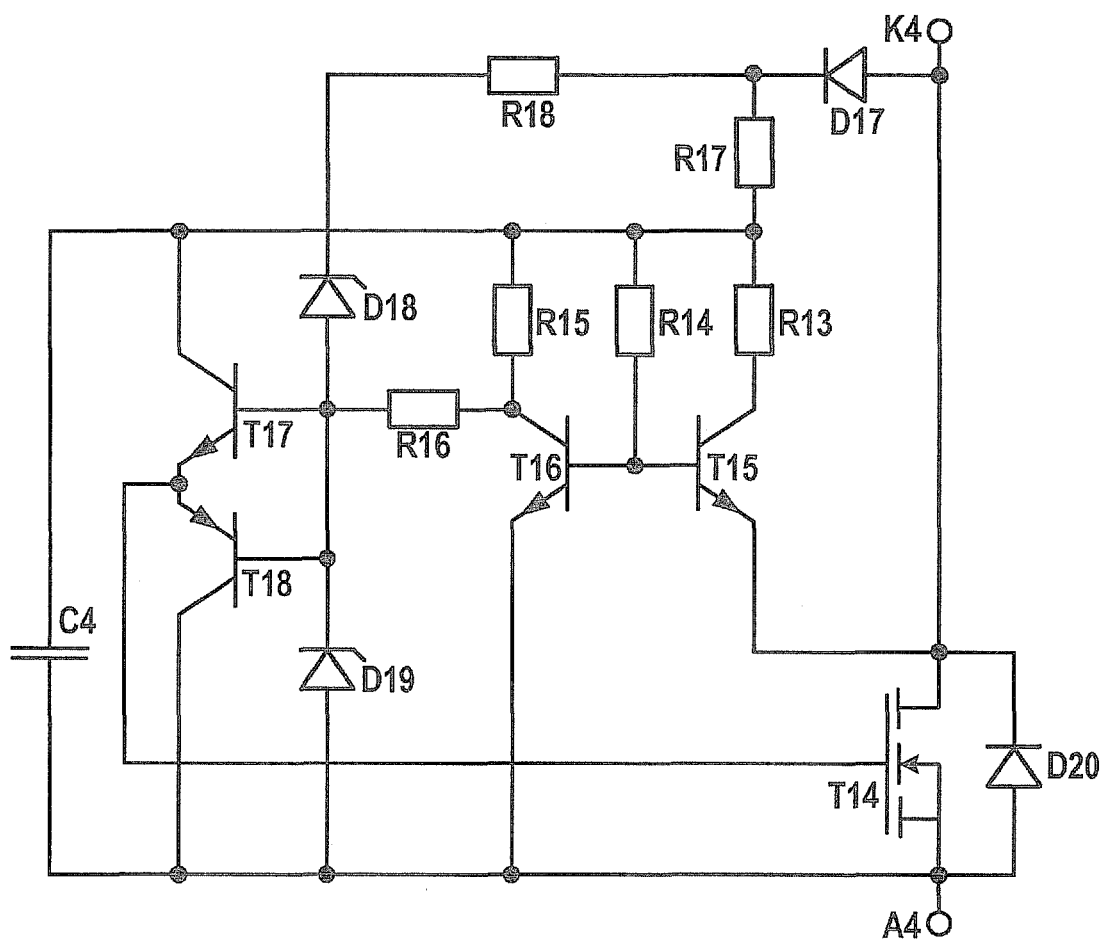
FIG. 5 shows a rectifier circuit according to a fourth exemplary embodiment of the present invention.

FIG. 5 shows a rectifier circuit according to a fourth exemplary embodiment of the present invention. The design and the functionality of the rectifier circuit shown in FIG. 5 agree to a great extent with the design and functionality of the rectifier circuit shown in FIG. 2. The rectifier circuit shown in FIG. 5 differs from the one shown in FIG. 2 in that the first input of differential amplifier T15, T16, R13, R14, R15 is not connected via a diode, but directly to cathode terminal K4 of the rectifier circuit and to the drain terminal of MOS transistor T14, and moreover, in that the second input of this differential amplifier is not connected via a diode, but directly to anode terminal A4 of the rectifier circuit. In this exemplary embodiment we assume that the base-to-emitter inverse blocking capability of transistor T15 of the differential amplifier is always greater than the maximum voltages present there during the operation of the rectifier circuit.

Figure 6:
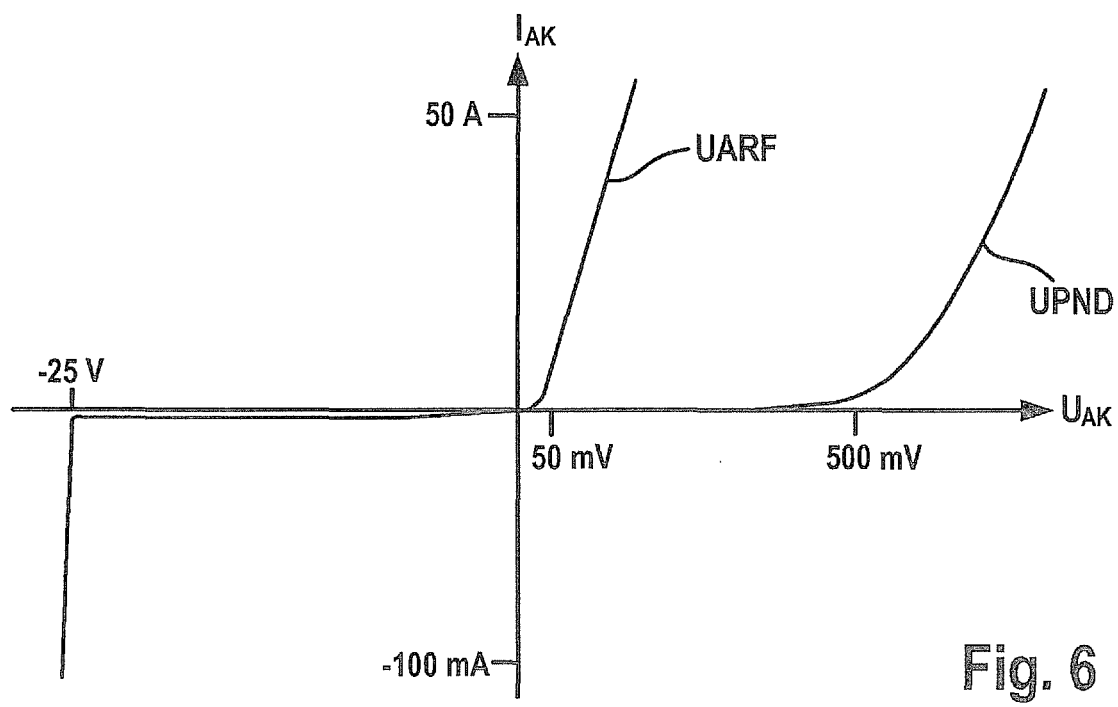
FIG. 6 shows in exemplary fashion the current-voltage characteristics line of a silicon p-n diode and the current-voltage characteristics line of a rectifier circuit according to the present invention.

FIG. 6 shows in exemplary fashion the current-voltage characteristics line of a silicon p-n diode and the current-voltage characteristics line of a rectifier circuit according to the present invention. It is clear from FIG. 6 that forward voltage UARF of a rectifier circuit according to the present invention is relatively small compared to forward voltage UPND of a silicon p-n diode.

Figure 7:
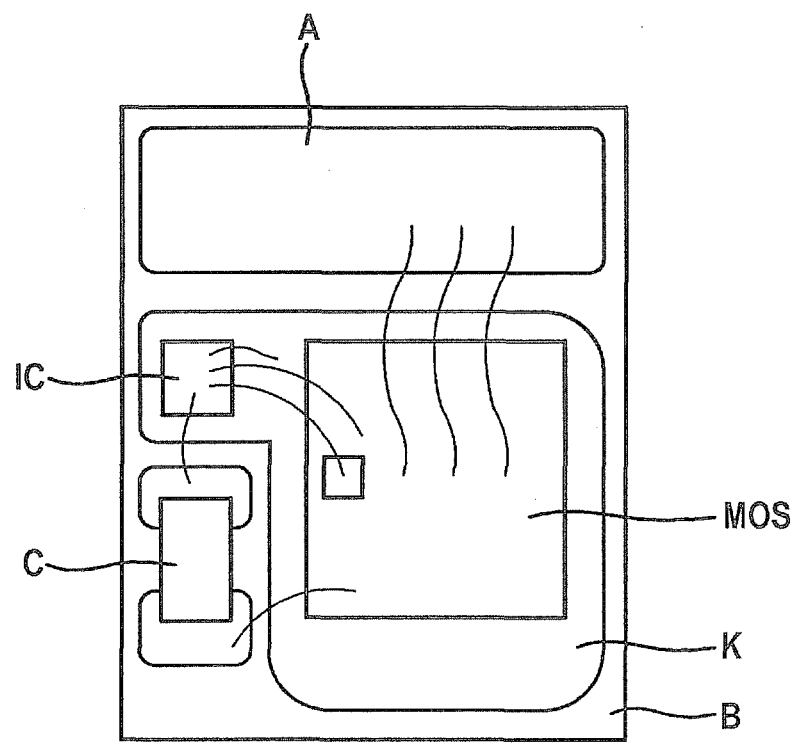
FIG. 7 depicts the implementation of a rectifier circuit according to the present invention in the form of an electronic component.

FIG. 7 depicts the implementation of a rectifier circuit according to the present invention in the form of an electronic component. Rectifier circuits according to the present invention may be composed of discrete components or of specially developed components. Such a low-loss electronic component is seen in FIG. 7, which is made up of a MOS transistor MOS, a capacitor C, a mounting rack B and an integrated circuit IC. Integrated circuit IC includes all electronic components of the rectifier circuit except the MOS transistor and the capacitor. The electronic component according to FIG. 7 is interconnectable in the same way as a silicon p-n diode. In this context, anode terminal A of the electronic component corresponds to the anode terminal of a silicon p-n diode, and cathode terminal K of the electronic component corresponds to the cathode terminal of a silicon p-n diode.

What is claimed is:

1. A rectifier circuit, comprising:
a cathode terminal;
an anode terminal; and
an electronic circuit provided between the cathode terminal and the anode terminal, which includes an MOS transistor having an integrated inverse diode, a capacitor and a differential amplifier;
wherein a first input of the differential amplifier is connected to the cathode terminal via a diode and a second input of the differential amplifier is connected to the anode terminal via a diode.

2. The rectifier circuit of claim 1, wherein the capacitor is connected to the cathode terminal via a diode.

3. The rectifier circuit of claim 1, wherein the capacitor is connected to the cathode terminal via a series connection of a diode and a resistor.

4. The rectifier circuit of claim 1, wherein the differential amplifier is constructed symmetrically.

5. The rectifier circuit of claim 1, further comprising:
a power amplifying stage.

6. The rectifier circuit of claim 5, wherein the input of the power amplifying stage is connected to the output of the differential amplifier.

7. The rectifier circuit of claim 5, wherein the power amplifying stage has two transistors whose gate terminals are connected to each other.

8. The rectifier circuit of claim 5, wherein the power amplifying stage has two transistors whose emitters are connected to each other.

9. The rectifier circuit of claim 5, wherein the output of the power amplifying stage is connected to the control input of the MOS transistor.

10. The rectifier circuit of claim 1, further comprising:
a limiter which limits the potential difference between the cathode terminal and the anode terminal to a predefined value.

11. The rectifier circuit of claim 1, further comprising:
at least one overvoltage protection element.

12. An electronic component for rectifying an alternating voltage, comprising:
   a cathode terminal;
   an anode terminal; and
   an electronic circuit provided between the cathode terminal and the anode terminal, which includes an MOS transistor having an integrated inverse diode, a capacitor and a differential amplifier;
   wherein a first input of the differential amplifier is connected to the cathode terminal via a diode and a second input of the differential amplifier is connected to the anode terminal via a diode.

13. The electronic component of claim 12, further comprising:
   at least one mounting rack;
   at least one MOS transistor (MOS);
   at least one integrated circuit (IC); and
   at least one capacitor (C).

14. A generator for providing a voltage supply of a motor vehicle, comprising:
   at least one rectifier circuit, the at least one rectifier circuit including:
      a cathode terminal;
      an anode terminal; and
      an electronic circuit provided between the cathode terminal and the anode terminal, which includes an MOS transistor having an integrated inverse diode, a capacitor and a differential amplifier;
      wherein a first input of the differential amplifier is connected to the cathode terminal via a diode and a second input of the differential amplifier is connected to the anode terminal via a diode.

15. A generator for providing a voltage supply of a motor vehicle, comprising:
   an electronic component for rectifying an alternating voltage, including:
      a cathode terminal;
      an anode terminal; and
      an electronic circuit provided between the cathode terminal and the anode terminal, which includes an MOS transistor having an integrated inverse diode, a capacitor and a differential amplifier;
      wherein a first input of the differential amplifier is connected to the cathode terminal via a diode and a second input of the differential amplifier is connected to the anode terminal via a diode.

* * * * *